US006964751B2

(12) United States Patent
Storm et al.

(10) Patent No.: US 6,964,751 B2
(45) Date of Patent: Nov. 15, 2005

(54) METHOD AND DEVICE FOR HEAT TREATING SUBSTRATES

(75) Inventors: Arjen Storm, Denhaag (NL); Ronald Bast, Leusden (NL); Vladimir Ivanovich Kuznetsov, Utrecht (NL); Jan Zinger, Dwingeloo (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 10/823,304

(22) Filed: Apr. 13, 2004

(65) Prior Publication Data

US 2004/0195737 A1 Oct. 7, 2004

Related U.S. Application Data

(62) Division of application No. 10/151,207, filed on May 16, 2002, now Pat. No. 6,746,237.

(30) Foreign Application Priority Data

May 16, 2001 (NL) .................................... 1018086

(51) Int. Cl.[7] ............................................... C21D 11/00
(52) U.S. Cl. ......................................... 266/87; 219/497
(58) Field of Search .............................. 266/78, 80, 87; 219/497; 432/249

(56) References Cited

U.S. PATENT DOCUMENTS

| | | | |
|---|---|---|---|
| 4,495,024 | A | 1/1985 | Bok |
| 4,560,590 | A | 12/1985 | Bok |
| 4,575,408 | A | 3/1986 | Bok |
| 4,860,687 | A | 8/1989 | Frijlink |
| 4,975,561 | A | 12/1990 | Robinson et al. |
| 5,314,848 | A | 5/1994 | Yasui et al. |
| 5,332,442 | A | 7/1994 | Kubodera et al. |
| 5,414,244 | A | 5/1995 | Imahashi |
| 5,430,271 | A | 7/1995 | Orgami et al. |
| 5,650,082 | A | 7/1997 | Anderson |
| 5,790,750 | A | 8/1998 | Anderson |
| 6,018,616 | A | 1/2000 | Schaper |
| 6,064,799 | A | 5/2000 | Anderson et al. |
| 6,072,163 | A | 6/2000 | Armstrong et al. |
| 6,080,969 | A | 6/2000 | Goto et al. |
| 6,097,005 | A | 8/2000 | Akimoto |
| 6,111,225 | A | 8/2000 | Ohkase et al. |
| 6,183,565 | B1 | 2/2001 | Granneman et al. |
| 6,207,936 | B1 | 3/2001 | De Waard et al. |

(Continued)

FOREIGN PATENT DOCUMENTS

| | | |
|---|---|---|
| EP | 08236533 | 9/1996 |

(Continued)

OTHER PUBLICATIONS

Porter et al., "Fast-ramp rapid vertical processor for 300-mm Si wafer processing". SPIE vol. 3507, *Sep. 1998* , p. 42-53.

*Primary Examiner*—Scott Kastler
(74) *Attorney, Agent, or Firm*—Knobbe, Martens, Olson & Bear, LLP.

(57) ABSTRACT

Method and device for the heat treatment of substrates, wherein the substrates are positioned in the vicinity of a heated, essentially flat furnace body extending over the surface of the substrate. In order to provide a reproducible treatment when treating a number of substrates successively, the temperature of the furnace body is measured so close to the surface adjacent to the substrate that the withdrawal of heat from the furnace body by the substrate can be detected. The introduction of each substrate takes place at a point in time when the temperature measured in this way is, within certain limits, equal to a desired initial treatment temperature $T_{trig}$.

11 Claims, 6 Drawing Sheets

U.S. PATENT DOCUMENTS

| | | | | | |
|---|---|---|---|---|---|
| 6,234,788 | B1 | | 5/2001 | Lee | |
| 6,275,744 | B1 | | 8/2001 | Yshida | |
| 6,329,304 | B1 | | 12/2001 | Kuznetsov et al. | |
| 6,561,798 | B2 | * | 5/2003 | Kuznetsov et al. | 432/249 |
| 6,610,968 | B1 | * | 8/2003 | Shajii et al. | 219/497 |
| 6,770,851 | B2 | * | 8/2004 | Granneman et al. | 219/390 |
| 2003/0209327 | A1 | | 5/2002 | Kuznetsov et al. | |
| 2004/0195737 | A1 | * | 10/2004 | Storm et al. | 266/80 |

FOREIGN PATENT DOCUMENTS

| | | | |
|---|---|---|---|
| EP | 10321505 | | 12/1998 |
| JP | 361294812 | A | 12/1986 |
| JP | 362021237 | A | 1/1987 |
| JP | 402034915 | A | 2/1990 |
| JP | 404078310 | A | 3/1992 |
| WO | 00/42638 | | 7/2000 |
| WO | 00/68977 | | 11/2000 |

* cited by examiner

METHOD AND DEVICE FOR HEAT TREATING SUBSTRATES

PRIORITY INFORMATION

This application is a divisional of U.S. patent application Ser. No. 10/151,207, filed May 16, 2002 now U.S. Pat. No. 6,746,237, which claims the priority benefit under 35 U.S.C. § 119 of Dutch Patent Application No. 1018086, filed May 16, 2001; the disclosures of these applications are hereby incorporated by reference in their entirety.

BACKGROUND OF THE INVENTION

1. Field of the Invention

The present invention relates in general to reactors for treating substrates. More particularly, the invention relates to reactors that process wafers and a method of operating such a reactor.

2. Description of the Related Art

When processing a substrate, such as a semiconductor wafer, the substrate is often heated with a heating means within a body of a furnace. It is customary that the energy supply to the heating means is controlled such that the measured temperature of the furnace body is substantially constant and has a desired value. When a number of substrates are subjected to a heat treatment one after the other, heat is withdrawn from the furnace body on the side of the furnace body adjacent to the substrate. Over the course of time a fall in the temperature of the furnace body will be detected by the temperature sensor. As a response to this, the energy supply to the heating means will be increased to such an extent that the furnace body again reaches the desired temperature. In view of the relatively high thermal capacity of the furnace body, this is a process that proceeds slowly and it can be some time before stable conditions have been established, in particular in those cases where the thermal capacity of the furnace body is so high and the treatment time so short that the temperature of the furnace body has still not been restored at the end of the treatment of a substrate. When a subsequent substrate has been loaded, heat is again withdrawn from the furnace body and in this way the temperature deviation can become increasingly greater for an initial number of substrates to be treated before it is finally restored as a result of the slow progression of the control process. The substrates subjected to treatment during this period will have received a non-uniform heat treatment.

These differences in heat treatment can be even greater than appears from the measured values produced by the temperature sensor. The temperature sensor is usually located within the furnace body, some distance away from the surface of the furnace body that is adjacent to the substrate. The heat, on the other hand, is withdrawn via the surface of the furnace body adjacent to the substrate. Decreases in the temperature of the furnace body of 10° C. or more are possible at the surface or in the immediate vicinity of the surface. This is, of course, undesirable.

In the case of some heat treatments according to the prior art, after the substrate has been positioned in the vicinity of the furnace body, there is a waiting period until a stable, desired temperature has been established, after which the actual treatment, for example the deposition of a layer with the aid of plasma enhanced chemical vapor deposition, starts. However, in some heat treatments (e.g., annealing), the entire temperature-time-profile (i.e., the "thermal budget") plays an important role in the treatment, especially when the treatment temperature is higher than approximately 500° C. Imposing a particular thermal budget on the substrates can even be the sole purpose of the treatment (e.g., without the formation of a layer on the substrate during the treatment). In such cases controlled and reproducible heating of the substrates is just as important as the final treatment temperature. In other words, it is important to achieve a thermal budget that is identical for all substrates when subjecting substrates to heat treatment. In principle, positioning the substrates in the vicinity of a relatively massive, heated furnace body is an extremely suitable method for this purpose, provided the disadvantages described above can be avoided.

SUMMARY OF THE INVENTION

A need therefore exists for a method and a device for heat treatment of substrates which avoid the disadvantages described above and which can achieve an identical heat treatment for successive substrates.

In one embodiment, a method for the successive heat treatment of a series of flat substrates comprises placing a substrates adjacent to, and essentially parallel to, a heating body having a flat boundary surface facing the substrate. The temperature in said heating body is measured at a location therein that is so close to the boundary surface that after the substrate has been placed in position the withdrawal of heat from the heating body by the substrate is measured at that location. The substrate is placed in the vicinity of said heating body, only after a desired temperature measured in the location has been reached. An amount of heat is supplied to said heating body such that the temperature measured at said location during the successive heat treatment of the series of substrates has an essentially constant value averaged over time. The substrate is removed from said heating body before said desired temperature, measured at said location, is reached again.

In this way an identical starting situation can be achieved for each substrate to be treated, which appreciably increases the reproducibility of the treatment. In a modified embodiment of the invention, after the substrate has been moved some distance away from the heated furnace body on completion of the heat treatment, it is moved into the vicinity of an essentially flat cooling body, so that cooling also takes place in a rapid and controlled manner.

The method described above can be carried out in various ways, in particular with regard to the control of the power supply to the heating means. For instance, it is possible in so-called "open loop control" to supply a constant power to the heating means and, at the point in time when the treatment of substrates starts, to increase the power supply in order to compensate for the heat withdrawn from the furnace body by the substrates. It is also possible in "closed loop control" to control the power supply in such a way that the temperature measured by the temperature sensor is constant. Both in the case of "open loop control" and in the case of "closed loop control" the control can be adjusted so that during the treatment of substrates the average temperature measured over time is somewhat higher than that in a state of rest. The result of this is that, following treatment and removal of a substrate, the temperature sensor indicates the desired temperature again within a shorter period and the introduction of the following substrate can start at an earlier point in time.

The method described above is particularly suitable for subjecting substrates to a heat treatment in a so-called "floating wafer reactor," as described in U.S. Pat. No.

6,183,565, which is hereby expressly incorporated by reference herein. In this floating wafer reactor flat substrates are brought one by one and successively between two essentially flat furnace bodies parallel to the substrate, after which the furnace bodies are moved towards one another and positioned a short distance away from the wafer. Preferably, the wafer is supported and held in place by gas streams, directed in opposing directions, issuing from these furnace bodies, without mechanical contact. With floating wafer reactors of this type it has proved possible to provide very rapid heating or cooling of the wafers without the wafers being damaged. As a result of the very rapid heating, wafers can also be treated very rapidly in succession.

According to another embodiment of the invention, substrates are treated in a treatment chamber in which, in addition to the heat treatment chamber, there is also a cooling station and a transport system for the substrate. The temperature of the substrate is lowered very rapidly in the cooling station under controlled conditions.

Yet another modified embodiment relates to a device for the heat treatment of a series of substrates. The device comprises a heating body with a flat surface for accommodating the substrate that is adjacent to the surface and controllable heating means for heating the heating body. At least one temperature sensor is positioned some distance away from the flat surface. The sensor is for measuring the temperature in the heating body and is connected to first control means for controlling the power supply to said heating means. Transport means are provided for positioning substrates in the vicinity adjacent to the heating body, holding them in this position and removing them therefrom. A second control means is provided for controlling the transport means. The temperature sensor is arranged near to the flat surface of the heating body in such a way that withdrawal of heat from the heating body by the substrate is detected. The first and second controllers are constructed such that moving each of the substrates into the heating body can take place only after a desired state has been reached. The desired state is determined by the temperature measured by the temperature sensor in the heating body as a function of time. The removal of each of said substrates takes place before said desired state has been achieved again.

According to an advantageous embodiment, the second controller comprises a low level control for controlling the motors of the transport means and a high level control for transmitting control signals to the low level control and receiving clearance signals. These clearance signals originate from sensors or from other control means and indicate that the device is ready for the next treatment action and that the device is in a safe condition for this further treatment action. One of these clearance signals originates, directly or indirectly, from the first controller for controlling the power supply to the heating means and is transmitted when the desired state has been reached within certain limits, determined on the basis of the signal transmitted by the said temperature sensor. The device can be provided with software to perform calculations on the signal transmitted by the temperature sensor in order to establish whether the desired state has been reached. This software can be operational in the first controller or a controller connected to this. When this clearance signal has been received and when any other requisite clearance signals are present, the high level control of the second control means gives a start signal to the low level control, which low level control causes the transport means to execute the desired movements. An unsafe condition of the device is determined by various sensors, such as sensors that indicate the position or presence of the substrate or of the transport means. If an unsafe condition is found while movements are being executed by the transport means, the high level control can transmit an interrupt to the low level control. As a result of this configuration, unspecified time delays in the substrate transport means as a consequence of checks carried out by the control are avoided and the transport of the substrates will take place as reproducibly as possible.

The heating means can be arranged in or on the furnace body or directly adjacent to the furnace body. It is also possible for the heating means to be arranged some distance away from the furnace body and for the heating means to comprise lamps or an induction coil.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

BRIEF DESCRIPTION OF THE DRAWINGS

The invention will be explained in more detail below with reference to the drawings. In the drawings.

DETAILED DESCRIPTION OF THE PREFERRED EMBODIMENT

In the methods described below, there is a controller for controlling the power supplied to the heating means. This controller will be provided with inputs for receiving signals from temperature sensors and an output for transmitting a signal that determines the power supplied to the heating means. This controller can be of any known type in the art.

Figure 1A:
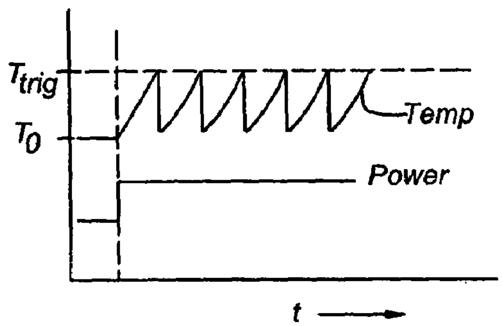
FIG. 1 shows, diagrammatically, variants of "open loop" methods of control of the power supply to the heating means.
Figure 1B:
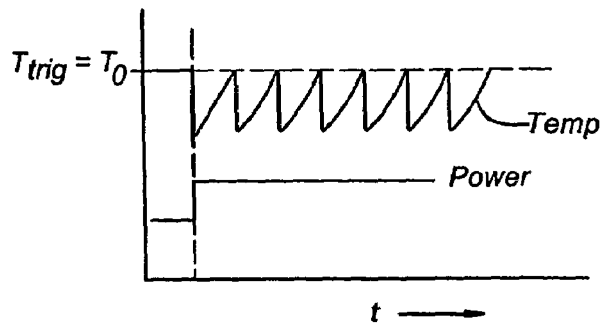

FIGS. 1*a* and 1*b* illustrate two "open loop" methods of controlling the power supply to a heating device, which have certain features and advantages according to the present invention. The abscissa shows the time and the ordinate the temperature of the furnace body and the power supplied to the heating means. At the start, the heat treatment device is in a state of rest, in which a constant power $P_0$ is supplied to the heating device and the furnace body is at an essentially constant temperature $T_0$ corresponding to that power.

In the method illustrated in FIG. 1*a,* the power is increased before treatment of substrates starts. As a consequence of this, the temperature of the furnace body will increase. When a desired temperature $T_{trig}$, has been reached, the first substrate is positioned in the vicinity of the heated furnace body and held in the vicinity of the heated furnace body for a certain period, after which the substrate is moved some distance away from the heated furnace body and cooled. There is then a waiting period until the temperature measured by the temperature sensor has once again reached the desired value, $T_{trig}$, at which point in time the next substrate is positioned in the vicinity of the furnace body. The same procedure is repeated until all substrates to be treated have been subjected to the heat treatment. In the method illustrated in FIG. 1*b,* the power to the heating device is increased at the same time as the first substrate is positioned in the vicinity of the furnace body. In this embodiment, $T_{trig}$ is equal to $T_0$, while in the embodiment illustrated in FIG. 1*a,* $T_{trig}$ is higher than $T_0$.

Figure 2A:
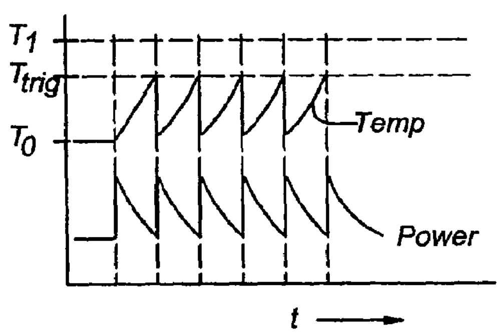
FIG. 2 shows, diagrammatically, variants of "closed loop" methods of control of the power supply to the heating means.
Figure 2B:
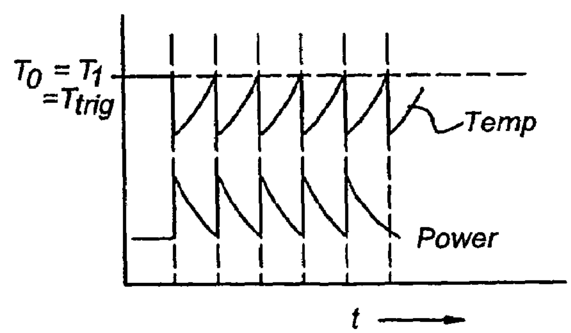

FIGS. 2*a* and 2*b* illustrate two "closed loop" methods of controlling the power supply to the heating device, which have certain features and advantages according to the present invention. In these figures, once again, the abscissa shows the time and the ordinate the temperature of the furnace body and the power supply to the heating device. At the start, the heat treatment device is in a state of rest, in which a power P is supplied to the heating device and controlled in such a way that the furnace body is at a constant temperature $T_0$.

In FIG. 2*a,* the temperature set point of the furnace body is raised to value $T_1$ before the treatment of substrates starts. As a consequence of this the temperature of the furnace body increases. When a desired temperature, $T_{trig}$, has been reached the first substrate is positioned in the vicinity of the heated furnace body and held in the vicinity of the heated furnace body for a specific period, after which the substrate is moved some distance away from the heated body and cooled. There is then a waiting period until the temperature measured by the temperature sensor has once again reached the desired value, $T_{trig}$, at which point in time the next substrate is positioned in the vicinity of the furnace body. The same procedure is repeated until all substrates to be treated have been subjected to the heat treatment. In FIG. 2*b,* the temperature set point remains the same and is $T_0=T_1=T_{trig}$. Even with good adjustment of the temperature controller, which is usually of the PID (proportional, integral, differential) type, the method illustrated in FIG. 2*b* will usually be significantly slower than the method illustrated in FIG. 2*a.*

In the methods illustrated in FIGS. 1 and 2, a temperature gradient, averaged over time, is established over the furnace bodies, where the temperature on the side of the furnace body facing away from the substrate is higher than the temperature on the side adjacent to the substrate. As a result a heat flow, averaged over time, is established in the direction of the substrate. This heat flow compensates for the heat taken up by the substrate. Instead of supplying additional heat only at the point in time when the heat withdrawn by the substrate is measured in a conventional manner as is done in the prior art, by establishing a gradient over the furnace body, the requisite amount of heat is provided earlier so that it is already on its way at the time of heat withdrawal. As a result, a much more rapid restoration of the temperature of the furnace body on the side facing the substrate is obtained than is the case with conventional temperature control.

Figure 3:
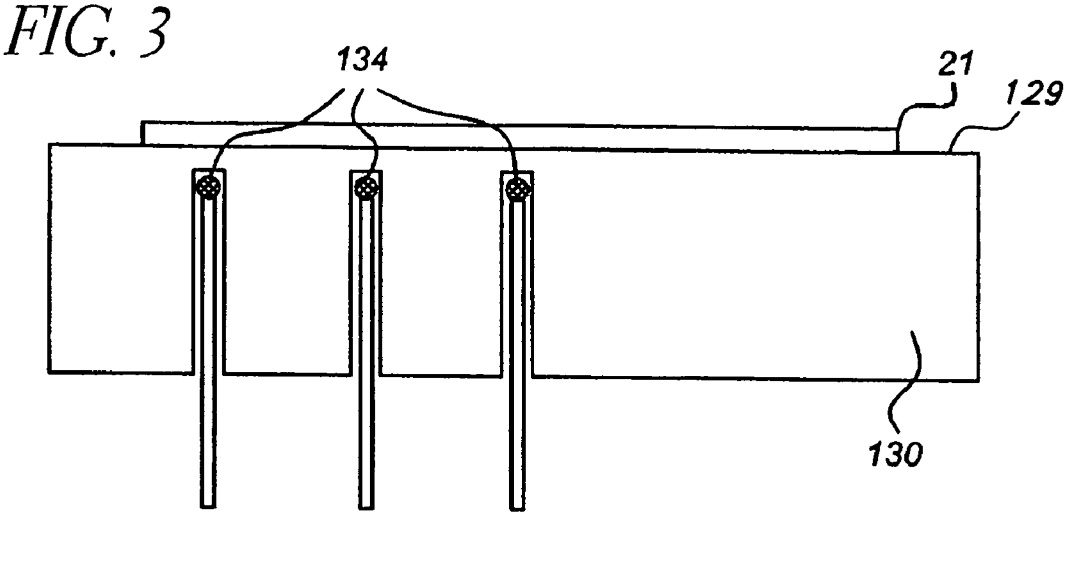
FIG. 3 shows, diagrammatically in cross-section, a furnace body with temperature sensors arranged therein.

FIG. 3 illustrates one embodiment of a furnace body 130, which may be used with the methods described above. The furnace body 130 includes several temperature sensors 134 arranged close to a surface 129 of the furnace body 130 adjacent to a substrate 21. It is preferable that the temperature sensors are arranged close to the surface 129 of the furnace body 120 adjacent to the substrate 21 at distance of less than 5 mm away and preferably a distance of approximately 2 mm or less away. As a result, the fall in temperature as a consequence of the withdrawal of heat from the furnace body 130 will be adequately detected.

In the description above, reference has been made to single sensor, but in practice there will usually be a need for several temperature sensors that distributed over the heated furnace body in order to be able to ensure that the furnace body has the desired temperature over the entire surface. The temperature signal that is used to start the substrate transport may be the average of all temperature signals originating from sensors that have been arranged in the vicinity of the surface of the furnace body. The control can also be implemented in such a way that the device is not cleared for loading a substrate if the temperature differences detected among the various sensors are too high. In a modified embodiment, the condition can be that all sensors must have reached a temperature that deviates from the desired temperature $T_{trig}$ by less than a determined value. A comparable measure may be applied when a heated furnace body is arranged on either side of the substrate, both furnace bodies being provided with one or more temperature sensors.

The heating devices can be constructed in such a way that they comprise several groups of individually controlled heating devices, distributed over different parts or zones of the furnace body. At least one temperature sensor is preferably available for each group. In the case of control in accordance with the "closed loop" principle, each temperature sensor is preferably arranged in the vicinity of that surface of the furnace body which is adjacent to the substrate. An advantage of the "closed loop" is that the desired temperature will be achieved for each part of the furnace body that is provided with a separate group of heating devices. In the case of the "open loop" control this is not necessarily the case and the power will have to be adjusted for each group in order to achieve a desired temperature. In the case of this "open loop" control it is not necessary to provide every zone of the furnace body with a temperature sensor arranged according to the invention, but it is possible to suffice with at least one temperature sensor, arranged close to the furnace body surface adjacent to the substrate. However, the other sensors are needed to establish correct adjustment of the constant power for each group, in such a way that a uniform temperature is obtained.

Figure 4:
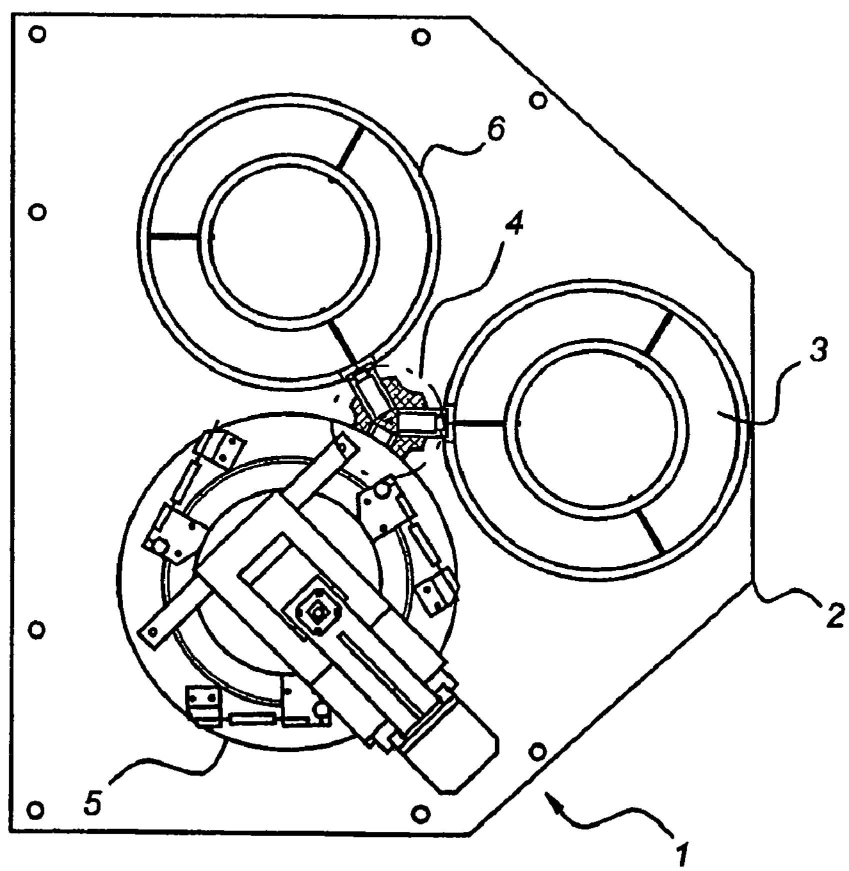
FIG. 4 shows, in plan view, a reactor for the successive treatment of substrates.

FIG. 4 illustrates an embodiment of a processing system 1, which has certain features and advantages according to the present invention and may be used with the control methods described above. This system is delimited by walls of a reactor chamber 2. A substrate can be introduced into or removed from a feed/discharge station 3, through a closure in the wall. The substrates are transported with the aid of a rotary transfer mechanism 4, which can be best seen in FIG. 5. The processing system further comprises a heating furnace 5 and a cooling station 6.

Substrates to be treated are transferred at the feed/discharge station 3 to the transfer mechanism 4 and are introduced first into the furnace 5, where they are subject to a rapid rise in temperature and then a heat treatment, followed by cooling in a controlled manner in the cooling station 6.

As mentioned above, the transfer mechanism is shown in FIG. 5. This mechanism includes a part 7 rigidly fixed to the housing and a rotary shaft 8, driven in any of a variety of known manners, provided with three arms 9, each of which includes supports 10 for substrates. A ring 11 is fitted around each of the supports 10. This ring 11 is configured such that that the substrate lies within it and loss of heat or supply of heat to the substrate is essentially uniform over the entire surface on exposure to a cooling body or a heated furnace body, respectively. That is, there is no or a very small amount of temperature deviation close to the edge of the substrate. Although three transport arms 9, each provided with a support 10 and ring 11, have been shown in both FIGS. 4 and 5, the transport mechanism can also be equipped with fewer arms. In some embodiments, it is desirable after removing the previous substrate to wait until the furnace body has reached the desired initial treatment temperature before positioning the next substrate in the vicinity of the furnace body. In such embodiments, it is possible for a single transport arm to suffice.

Figure 6:
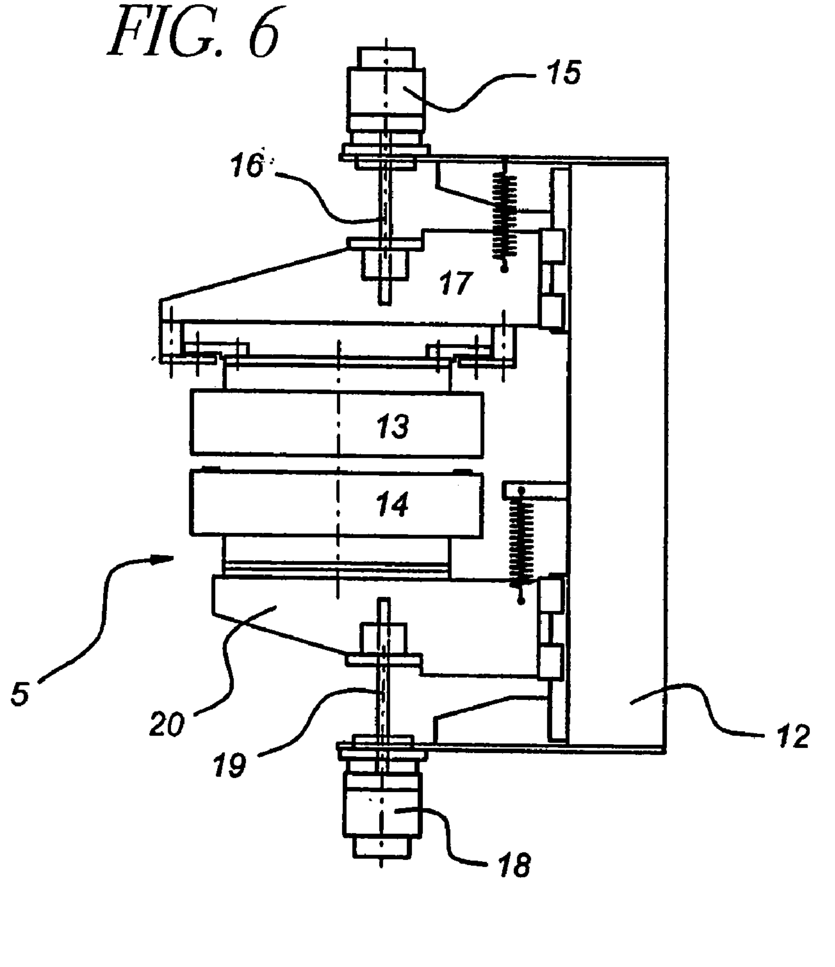
FIG. 6 shows, in a side view, the furnace bodies of the floating wafer reactor with mounting and movement mechanism.
Figure 7A:
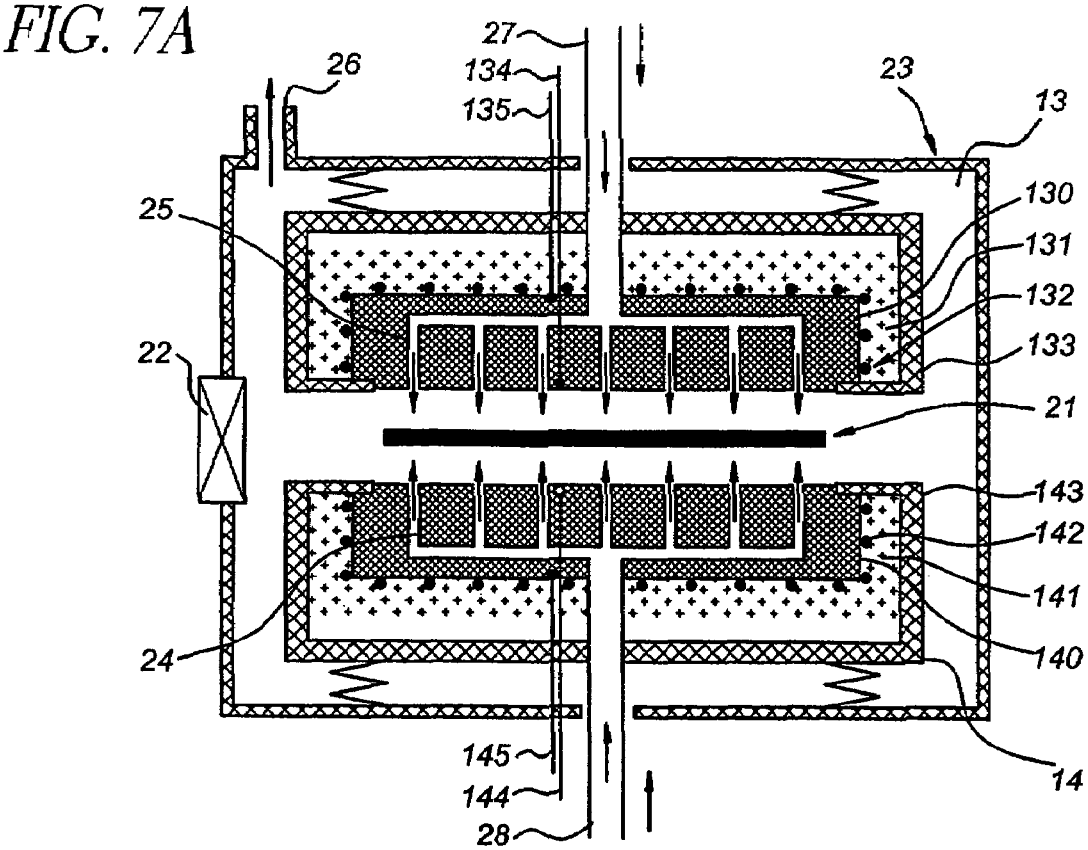
FIG. 7*a* shows, diagrammatically, the treatment of substrates in a floating wafer reactor, with the reactor open.
Figure 7B:
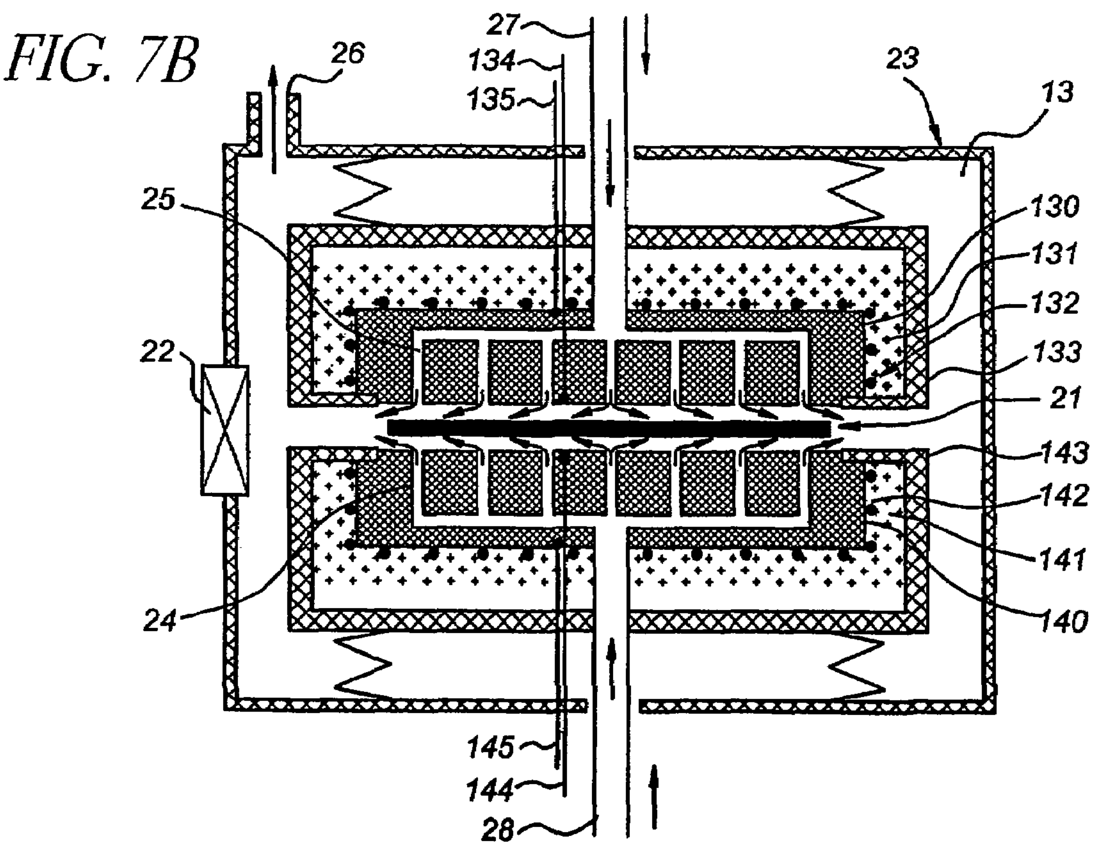
FIG. 7*b* shows, diagrammatically, the treatment of substrates in a floating wafer reactor, with the reactor closed.

With reference to FIGS. 6 and 7, the furnace 5 of the illustrated embodiment will be described in more detail. The furnace 5 includes an upper block 13 and a lower block 14 that are in a housing 23, which is provided with a flap 22 that can be opened for loading and subsequently removing a substrate 21. Lower block 14 and upper block 13 can be moved towards one another by lifting rods 27 and 28. Upper block 13 is made up of a upper furnace body 130, an insulating jacket 131, a heating coil 132, arranged on the inside of the insulating jacket, and an outer jacket 133. Similarly, lower block 14 is made up of a lower furnace body 140, an insulating jacket 141, a heating coil 142, arranged on the inside of the insulating jacket, and an outer jacket 143.

The upper furnace body 130 is preferably provided with at least one temperature sensor 134 and the lower furnace body 140 is preferably also provided with at least one temperature sensor 144. As described above, in one embodiment, the temperature sensors 134, 144 are arranged close to the surfaces of the furnace bodies 130, 140 that are adjacent to the substrate. In a preferred embodiment of the invention, the upper furnace body 130 is also provided with a temperature sensor 135 that is arranged close to that side of the upper furnace body that faces away from the substrate. In a similar manner, the lower furnace body 140 can be provided with a temperature sensor 145 arranged close to that side of the lower furnace body 140 that faces away from the substrate. Gas is supplied both from the lower furnace body 140 through openings 24 and from the upper furnace body 130 through openings 25. Gas is discharged through a discharge opening 26 formed in the housing. When a substrate is introduced, upper block 13 and lower block 14 are preferably in a position in which they have been moved apart. After the substrate has been introduced, the blocks are moved towards one another by lifting rods 27 and 28 in such a way that the distance between each of the substrate surfaces and the adjacent surfaces of the furnace bodies is preferably less than 2 mm and more preferably 1 mm or less. In the illustrated embodiment, the substrate is held in a stable position by the gas streams issuing from the openings 24 and 25, without further mechanical support being required. In other arrangements, support pins can space the substrate from the bodies 130, 140.

In the illustrated embodiment, the presence of the temperature sensors 134, 144 close to the substrate and of the temperature sensors 135, 145 close to the furnace body makes it possible to use a cascade temperature controller. This is a control that makes use of the temperature sensors in both positions. The advantage of such a control is that because the temperature sensors are close to the substrate a correct temperature can be achieved in this location and the withdrawal of heat is measured rapidly, while as a result of the temperature sensors 135, 145 close to that side of the furnace body located opposite the substrate, the temperature remains readily controllable and, for example, it is possible to avoid the outside of the furnace body reaching too high a temperature, which would tend to be followed after some time by the inside of the furnace body reaching too high a temperature. For a cascade control of this type, temperature sensors 135 and 145 do not necessarily have to be arranged close to that side of the furnace body that is facing the heating device. The temperature sensors can, for example, be arranged more in the interior of the furnace body, but the distance to that surface of the furnace body which is adjacent to the substrate will be greater than the distance to that side of the furnace body facing the heating device.

Figure 5:
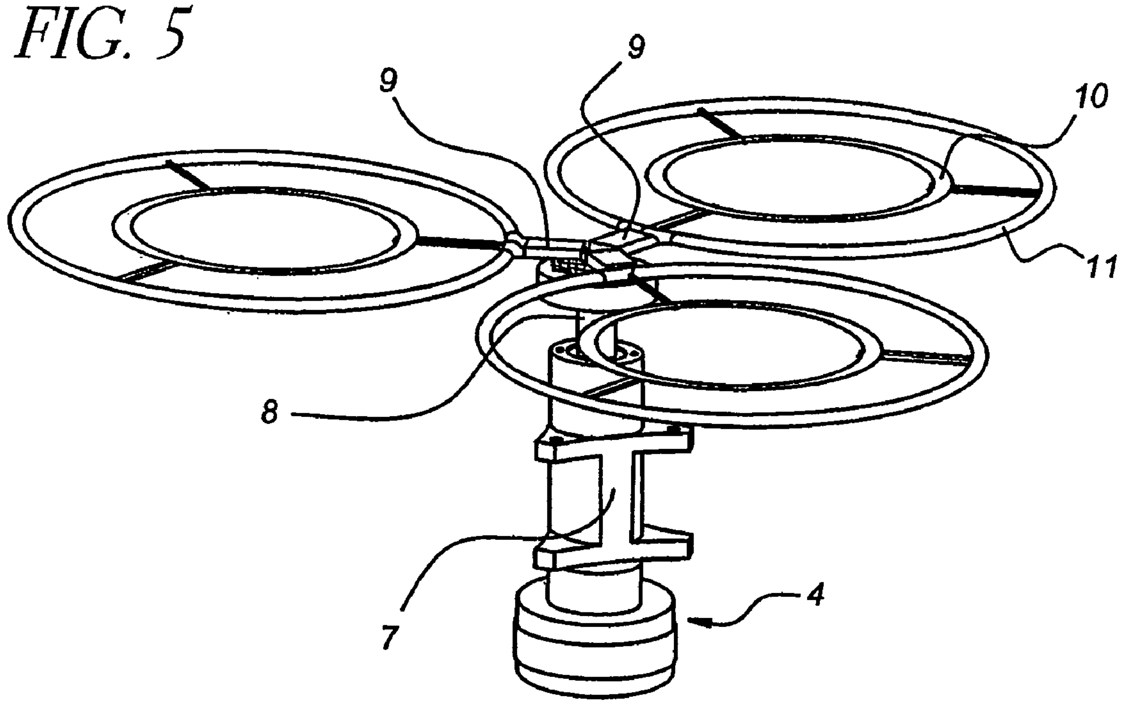
FIG. 5 shows, in perspective, the transport mechanism used in the preferred floating wafer reactor.
Figure 8:
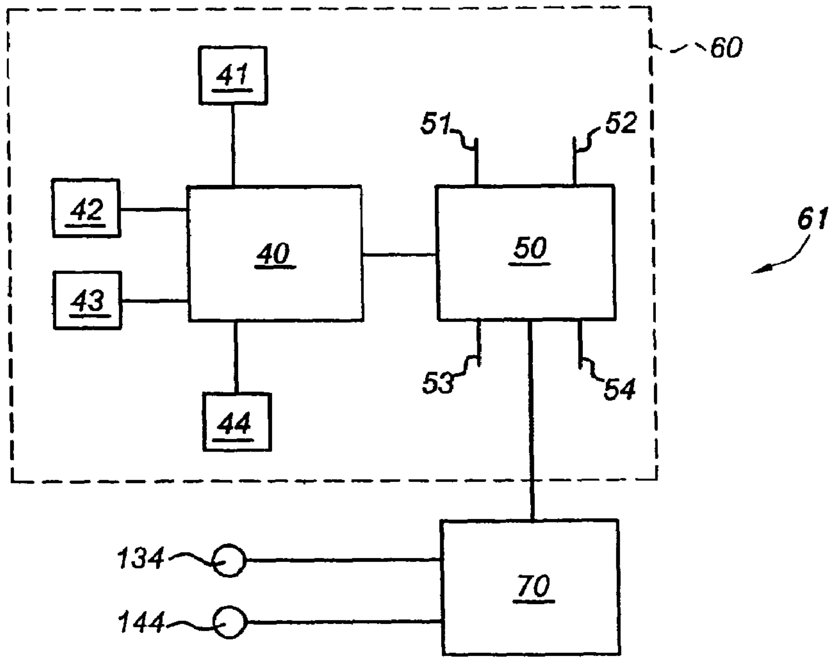
FIG. 8 shows the controller for controlling the transport means.

FIG. 8 is a schematic illustration of a control system 61, which has certain features and advantages according to the present invention and can be used to control the processing system 1 described above. A first controller 70 is connected to the temperature sensors 134 and 144. A second controller 60 is connected to the first controller 70 and functions to control the transport device 4 (FIG. 5). The second controller 60 comprises the high level control 50 and the low level control 40.

High level control 50 is provided with inputs 51, 52, 53 and 54 for receiving clearance signals. At least one of these clearance signals originates, directly or indirectly, from the first controller 70 and indicates that the furnace body has a desired temperature, within certain limits, close to the surface adjacent to the substrate. Drives 41, 42, 43 and 44 for driving the transport device are connected to low level control 40. The transport device may comprise substrate transport device and furnace body transport device. High level control 50 transmits data on the movements to be executed to control 40. These movements are executed only after receipt of a start signal originating from control 50. This start signal is transmitted when all applicable clearance signals have been received by high level control 50. The movements are executed after transmission of the start signal to the low level control. Possible unsafe situations are verified by high level control 50. If any unsafe situation is detected by one of the clearance signals dropping out while executing the movements, the high level control 50 then transmits an interrupt to the low level control 40, on receipt of which the movement is discontinued. As a result of not burdening the low level control 40 with a wide variety of verifications, which can lead to small but undefined delays, the movements are executed as reproducibly as possible, which also benefits the reproducibility of the heat treatment.

It will be clear that for the illustrated embodiment of the control system 61 can be modified. For example it is possible to control the power supply to the heating device by the first controller 70. Also a separate controller can be used to that end. The first and second controller can be connected directly through a main controller. All controllers can be incorporated in a single controller (e.g., a microprocessor or computer).

Figure 9:
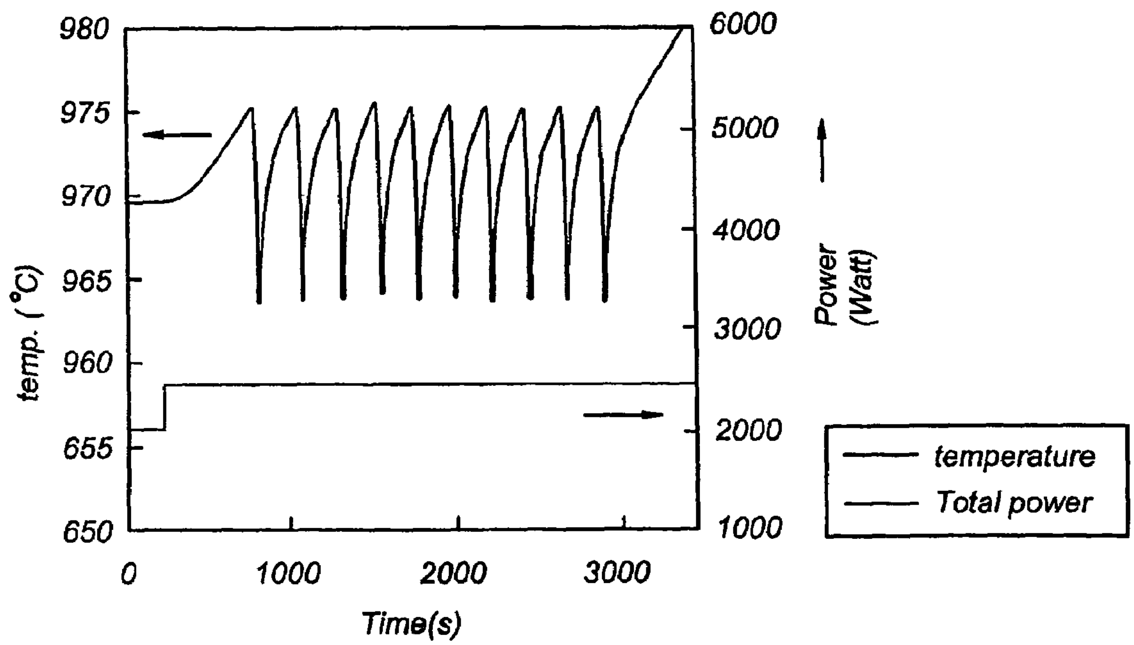
FIG. 9 shows a graph of the changing temperature in the furnace during successive introduction and removal of a number of substrates.

FIG. 9 is a graph that illustrates a measured change in temperature as a function of time. The continuous line indicates the temperature and the dotted line the power taken up by the heating device. In this case, the above described "open loop control" is being used, that is to say a constant power is supplied to the heating device. The power supplied is increased before a substrate is introduced. The consequence of this is that the measured temperature rises. Once a specific value has been reached, in this case 975° C., a substrate is positioned in the vicinity of the furnace body and a reduction in temperature takes place. After the substrate has been removed, the next substrate is not introduced until the temperature sensor again indicates 975° C. It will be clear that the increase in the power that has been set at the start of the successive treatments is preferably matched to the power taken from the furnace body by the substrates. If too small an increase in the power is set, it will take too long before the temperature has been restored again. If too high an increase in the power is set, the temperature can then reach too high a value. In FIG. 9 it can be seen that if no further substrates are introduced after the successive introduction of ten substrates, while the power remains set at the higher value, the temperature reaches a value higher than that desired. It can be seen from FIG. 9 that each of the ten substrates has been subjected to as uniform as possible a thermal budget, as a result of which optimum reproducibility of heat treatments can be achieved.

Figure 10:
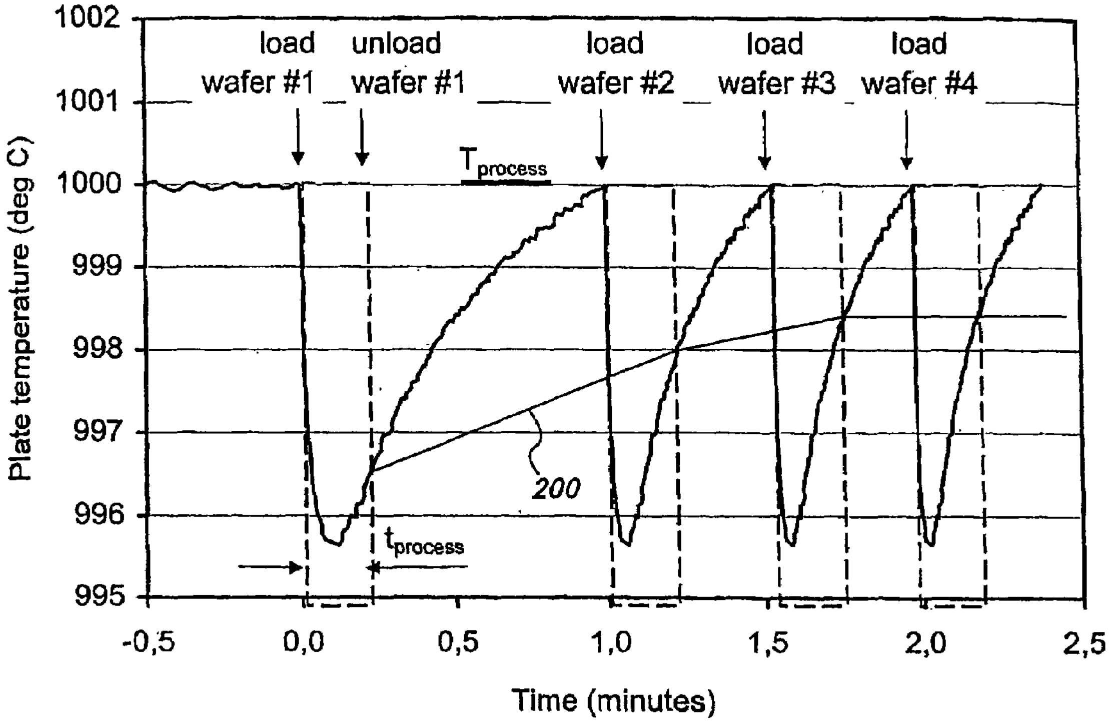
FIG. 10 shows a graph of the changing temperature in the furnace body during the successive introduction and removal of a number of substrates, in which the "first substrate effect" can clearly be seen.

FIG. 10 illustrates in more detail the temperature profile when the substrates are introduced into the furnace when the desired temperature $T_{trig}$ is reached. In this figure, the points in time at which wafers #1, #2, #3 and #4 are loaded are indicated by arrows. The point in time at which a wafer is unloaded is indicated by a dotted vertical line. In the example shown, the temperature of the furnace body has been set at 1000° C. and the wafers are each loaded when the initial treatment temperature of 1000° C. has been reached. When the first wafer is positioned adjacent to the furnace body, heat is withdrawn from the furnace body. This withdrawal of heat is detected by the temperature sensors and transmitted to a controller to control the power supply to the furnace body. The heating device is, however, placed some distance away from the boundary surface of the furnace body facing the wafer. A temperature gradient, therefore, will be established between the heating device and the boundary surface of the furnace body facing the wafer, so that, averaged over time, a heat flow will be set up to compensate for the heat withdrawn from the furnace body by the wafers.

Wafer #2 is loaded when the temperature reaches 1000 C again. In a similar manner, wafer #3 and 4 are loaded when the temperature reaches 1000 C. If no substrate were to be loaded the temperature would rise to a value above 1000 C because of the inertia of the system. In FIG. 10, it can be seen that it takes some time before a constant pattern is established. Thus, the temperature is not constant at the point in time when a wafer, is unloaded. That is, the temperature when wafer #1 is unloaded is less than the temperature when wafer #2 is unloaded. See curve 200, joining the intersections of wafer unload times and the temperature curve. It can be seen that a reproducible pattern is established only after a few wafers (see e.g., the temperature when wafers #3 and #4 are unloaded).

The thermal budget to which a wafer is subjected is, of course, not determined exclusively by the initial treatment temperature measured, but also by the temperature gradient that exists in the furnace body at the point in time when the heat treatment starts. It can be concluded from the fact that the temperature profile in FIG. 10 varies over time that the temperature gradient in the furnace body is not constant.

Figure 11:
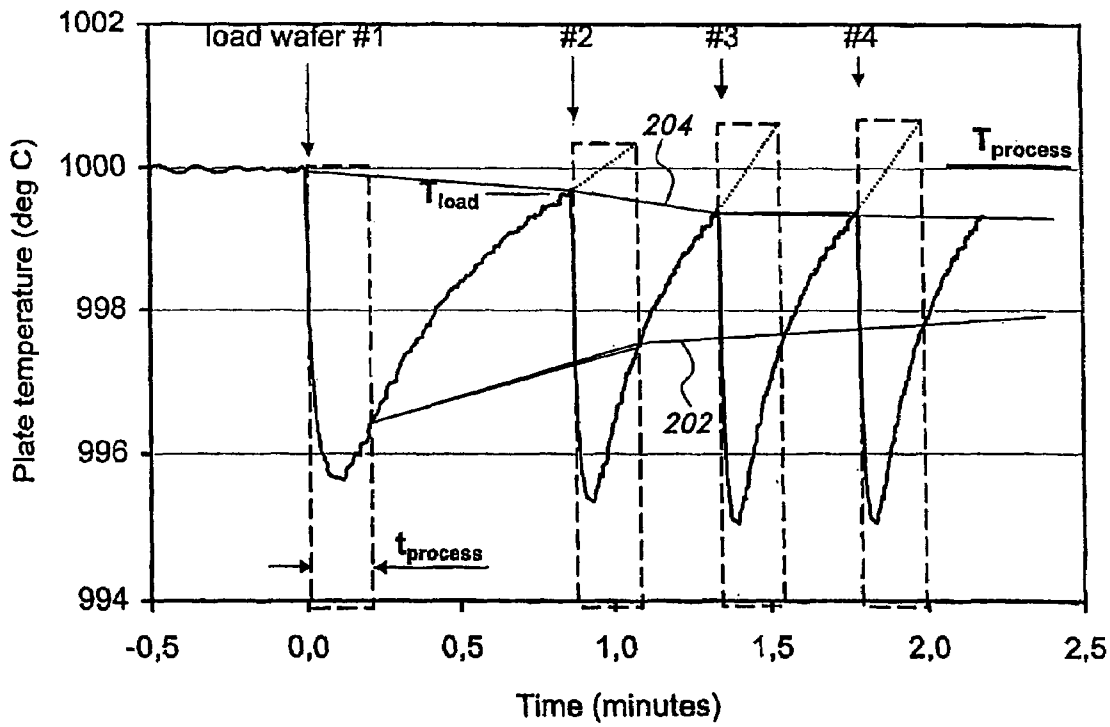
FIG. 11 shows a graph of the changing temperature in the furnace body during successive introduction and removal of a number of substrates, where the time of introduction is determined on the basis of the measured and extrapolated temperature.

FIG. 11 illustrates to another embodiment of the present invention, which compensates for the variability noted above. In this figure, the points in time at which wafers #1, #2, #3 and #4 are loaded are again indicated by arrows. The point in time at which each wafer is unloaded is also indicated by a dotted vertical line. In this embodiment, the temperature of the furnace body, as measured close to the boundary surface facing the wafer, is extrapolated over the future time. In the example in FIG. 11, the period over which the extrapolation is carried out is equal to the treatment time $t_{process}$. The desired state to be reached before a wafer is introduced is in this case not a desired constant value of the measured temperature but the temperature at which the extrapolated temperature, averaged over the time for which the treatment is to be carried out, has a desired constant value. In the example in FIG. 11 this desired value is 1000° C. and a linear extrapolation is made. Wafers #2, #3 and #4 are thus loaded at the points in time when the value of the extrapolated temperature, averaged over the time $t_{process}$ for which the treatment is to be carried out, is 1000° C. For a linear extrapolation this temperature will be reached precisely halfway through the indicated period. This implies that, compared with wafer #1, wafer #2 is loaded at a somewhat lower measured temperature and is unloaded at a somewhat higher extrapolated temperature. It can also be seen from FIG. 11 that the actual measured temperature at the point in time when wafer #2 is unloaded is higher than that for wafer #1. For wafers #3 and #4 the measured temperatures at the time of loading are a little lower again than for wafer #2 and at the time of unloading are somewhat higher than for wafer #2. This pattern is best seen by reference to line 202, which joins the unload temperatures for each wafer, and line 204, which joins the load temperatures for each wafer. It has been found that a treatment carried out in accordance with this embodiment yields a more reproducible result, indicating more consistent consumption of thermal budget as compared to the method of FIG. 10.

The time that is needed for loading a wafer can also be taken into account in this development. If the time that is needed for loading a wafer is $t_{load}$, the extrapolation can be carried out over a period $t_{load}$, so that there is a desired temperature at the point in time when the wafer is placed in the vicinity of the heating body, adjacent to the latter. This is of importance particularly when the loading time is of the same order of magnitude, or longer than, the treatment time. The extrapolations are realized by the device. Finally, both developments can be combined, so that the extrapolation is carried out over a period $t_{load}+ t_{process}$ and the wafer is loaded at the point in time when the extrapolated temperature, averaged over the period $t_{load}$, $t_{load}+t_{process}$, has the desired value. For the extrapolation good results are obtained with a linear extrapolation in accordance with the least squares method, where the period that was used as starting point for the extrapolation was approximately one fifth of the period between loading successive wafers. It is, of course, possible to use higher order polynomials for the extrapolation, although tends to increase the risk of instability in the calculation.

Although the invention has been described above with reference to preferred embodiments, it must be understood that these preferred embodiments serve only for illustration. For instance, the control of the power supply to the heating device can be implemented in a way other than those described. The substrate can also be supported in various ways during the treatment, both mechanically and non-mechanically. The substrate can also be placed at different distances in the vicinity of the furnace body. A further variant is that the substrate is brought into contact with the furnace body and may be pressed against the furnace body to promote the thermal contact. These variants will be obvious to a person skilled in the art and fall within the scope of the appended claims.

We claim:

1. A device for the heat treatment of a series of substrates, comprising a hearing body with a flat surface for accommodating a substrate adjacent to said surface, controllable heating means for heating said heating body, a digital control means, at least one temperature sensor configured to measure the temperature in said heating body and arranged in said heating body near to said flat surface such that withdrawal of heat from said heating body by said substrate is detected, wherein said heating means are connected to said control means, wherein said temperature sensor is connected to said control means, transport means for positioning substrates in the vicinity of said heating body adjacent to said flat surface and for removing substrates therefrom, wherein said transport means are connected to said control means, said control means being provided with extrapolation software for extrapolating over a time interval the temperature measured by said temperature sensor, and said control means arranged in such a way that each of said substrates is positioned in the vicinity of said heating body when the temperature extrapolated over said time interval has reached a desired temperature value.

2. The device according to claim 1, wherein said at least one temperature sensor is arranged in the heating body a distance of less than 5 mm away from said flat surface.

3. The device according to claim 2, wherein said at least one temperature sensor is ranged in the heating body a distance of less than approximately 2 mm away from said flat surface.

4. The device according to claim 1, wherein said control means comprise a low level control means for controlling said transport means and high level control means, wherein said high level and said low level control means are arranged in such a way that after emission of a starting signal by said high level control means to said low level control means, said low level control means enables said transport means to perform a plurality of movements according to a predetermined pattern, and wherein said high level control means is arranged for monitoring unsafe situations based on input signals during the performance of one of said plurality of movements and is arranged for emitting a interrupt signal to the low level control means if an unsafe situation occurs.

5. The device according to claim 1, comprising a second hearing body with a second flat surface for accommodating a substrate adjacent to said surface, wherein said heating body and said second heating body are arranged such that said flat surface and said second flat surface are parallel to each other and relatively moveable towards and from each other for accepting and releasing of said substrate between said heating body and said second heating body, wherein said second heating body is provided with second controllable heating means for heating said second heating body, at least one second temperature sensor, arranged in said second heating body near to said flat surface such that withdrawal of heat from said second heating body by said substrate is detected and wherein said second heating means are connected to said control means, and wherein said control means are arranged in such a way that said positioning of each of said series of substrates in the vicinity of said heating body and said second heating body is able to take place only if the temperature measured by said second temperature sensor and extrapolated over said time interval has reached a desired temperature value.

6. The device according to claim 1, further comprising a cooling body with a cooling chamber for accommodating the substrate, wherein the cooling body is arranged in an extension of a transport direction of transport means.

7. The device according to claim 1, wherein said time interval is substantially equal to the time needed to load a substrate in the vicinity of said heating body.

8. The device according to claim 1, wherein said heating means are positioned closer, as compared to the at least one temperature sensor, to a second side of said heating body, the second side being generally opposite to said surface.

9. The device according to claim 8, further comprising a second temperature sensor located closer to said second side than said at least one temperature sensor.

10. The device according to claim 9, further comprising a second temperature sensor located closer to said second side than said at least one temperature sensor.

11. The device according to claim 10, wherein the second temperature sensor is connected to said control means and said control means is arranged such that a temperature gradient will be established over the heating body between said surface and said second side.

* * * * *

UNITED STATES PATENT AND TRADEMARK OFFICE

CERTIFICATE OF CORRECTION

PATENT NO. : 6,964,751 B2
APPLICATION NO. : 10/823304
DATED : November 15, 2005
INVENTOR(S) : Arjen Storm et al.

It is certified that error appears in the above-identified patent and that said Letters Patent is hereby corrected as shown below:

Column 11, Line 23, in Claim 1, delete “hearing” and insert --heating--, therefor.

Column 11, Line 47, in Claim 3, delete “ranged” and insert --arranged--, therefor.

Column 12, Line 9, in Claim 5, delete “hearing” and insert --heating--, therefor.

Signed and Sealed this

Third Day of April, 2007

JON W. DUDAS

*Director of the United States Patent and Trademark Office*